United States Patent
Chuang

(10) Patent No.: US 7,956,418 B2
(45) Date of Patent: Jun. 7, 2011

(54) ESD PROTECTION DEVICES

(75) Inventor: Chien-Hui Chuang, Taipei County (TW)

(73) Assignee: Mediatek Inc., Hsin-Chu (TW)

( * ) Notice: Subject to any disclaimer, the term of this patent is extended or adjusted under 35 U.S.C. 154(b) by 358 days.

(21) Appl. No.: 12/125,241

(22) Filed: May 22, 2008

(65) Prior Publication Data

US 2008/0296613 A1 Dec. 4, 2008

Related U.S. Application Data

(60) Provisional application No. 60/940,467, filed on May 29, 2007, provisional application No. 60/956,132, filed on Aug. 16, 2007.

(51) Int. Cl.
*H01L 23/60* (2006.01)

(52) U.S. Cl. .. 257/355; 257/173; 257/356; 257/E21.611

(58) Field of Classification Search .......... 257/173–174, 257/355–357, E21.611
See application file for complete search history.

(56) References Cited

U.S. PATENT DOCUMENTS

| | | | | |
|---|---|---|---|---|
| 4,792,840 A * | 12/1988 | Nadd | ............................. | 257/495 |
| 5,053,743 A * | 10/1991 | Mille et al. | .................... | 338/297 |
| 5,698,873 A * | 12/1997 | Colwell et al. | ................ | 257/206 |
| 6,157,048 A * | 12/2000 | Powell | ............................. | 257/59 |
| 6,583,001 B1 * | 6/2003 | Burr | ............................. | 438/238 |
| 2002/0122280 A1 | 9/2002 | Ker et al. | | |
| 2003/0168712 A1 * | 9/2003 | Shin et al. | ..................... | 257/510 |

* cited by examiner

*Primary Examiner* — A. Sefer
*Assistant Examiner* — Allen L Parker
(74) *Attorney, Agent, or Firm* — Thomas|Kayden

(57) ABSTRACT

An ESD protection device is provided. The ESD protection device comprises an SCR and an ESD detection circuit. The SCR is coupled between a high voltage and a ground and has a special semiconductor structure which saves area. When the ESD detection circuit detects an ESD event, the ESD detection circuit drives the SCR to provide a discharging path.

14 Claims, 7 Drawing Sheets

ESD PROTECTION DEVICES

CROSS REFERENCE TO RELATED APPLICATIONS

The present application claims the benefit of U.S. provisional application entitled "LOW LEAKAGE POWER ESD CLAMP", Ser. No. 60/940,467, filed May 29, 2007, and the benefit of U.S. provisional application entitled "LOW LEAKAGE POWER ESD CLAMP", Ser. No. 60/956,132, filed on Aug. 16, 2007, which are incorporated herein by reference.

BACKGROUND OF THE INVENTION

1. Field of the Invention

The invention relates to an ESD protection device, and more particularly to an SCR-based ESD protection device.

2. Description of the Related Art

Electrostatic discharge (ESD) damage has become one of the main reliability concerns facing integrated circuit (IC) products. Particularly, when scaled down to the deep submicron regine, integrated circuits become more vulnerable to ESD stress. Semiconductor controlled rectifier (SCR) devices had been used as an ESD protection device to protect complementary metal oxide semiconductor (CMOS) integrated circuit against damage. The SCR devices have the advantage of low holding voltage, which results in less power dissipation in the SCR devices under the ESD event than other ESD protection devices, such as thin oxide NMOS, or diode, in the CMOS technologies. Thus, the SCR devices can sustain much higher ESD voltage with a smaller layout area.

MOS transistors and SCR devices are both efficient protection devices, however, the MOS transistors are widely used in the industry. This is because the SCR device used for an ESD protection in deep submicron CMOS technologies has the latch-up issue.

Thus, it is desired to provide a novel SCR device structure with lath-up free to protect integrated circuits in low operating voltage application.

BRIEF SUMMARY OF THE INVENTION

One exemplary embodiment of an ESD protection device comprises a substrate, a first doping region, a first MOS transistor structure, a second MOS transistor structure, a sixth doping region, and a first well region. The first doping region is formed in the substrate and encloses an active region, wherein the first doping region is coupled to a first node. The first MOS transistor structure is on the internal of the active region and comprises a second doping region, a third doping region, and a first gate. The second doping region is formed in the substrate and comprises a first portion and a second portion, wherein the second doping region is coupled to the first node. The third doping region is formed in the substrate. The first gate is formed on the substrate and between the second portion of the second doping region and the third doping region.

The second MOS transistor structure is on the internal of the active region and comprises a fourth doping region, a fifth doping region, and a second gate. The fourth doping region is formed in the substrate and comprises a first portion and a second portion, wherein the fourth doping region is coupled to a second node. The fifth doping region is formed in the substrate. The second gate is formed on the substrate and between the first portion of the fourth doping region and the fifth doping region. The third doping region is near the second portion of the fourth doping region, and the fifth doping region is near the first portion of the second doping region. The sixth doping region is formed in the substrate and on one side of the first and second MOS transistor structures, wherein the sixth doping region is coupled to the second node. The first well region is on the internal of the active region and formed in the substrate and under one part of the third doping region, one part of the fifth doping region, the fourth doping region, and the sixth doping region.

Another exemplary embodiment of an ESD protection device comprises a substrate, first to sixth doping regions, first and second gates, and a first well region. The first doping region is formed in the substrate and coupled to a first node. The second doping region is formed in the substrate and encloses the first doping region, wherein the second doping region comprises a first portion and a second portion and is coupled to the first node. The third doping region is formed in the substrate and encloses the first portion of the second doping region, wherein the third doping region has a first opening. The first gate is formed on the substrate and between the first portion of the second doping region and the third doping region. The fourth doping region is formed in the substrate and encloses the second portion of the second doping region, wherein the fourth doping region has an second opening corresponding to the first opening. The fifth doping region is formed in the substrate and comprises a first portion and a second portion, wherein the first portion of the fifth doping region encloses the third doping region, and the second portion thereof encloses the fourth doping region. The second gate is formed in the substrate and between the second of the fifth doping region and the fourth doping region. The sixth doping region is formed in the substrate and encloses the fifth doping region, wherein the fifth and sixth doping regions are coupled to a second node. The first well region is formed in the substrate and under the first doping region, the second doping region, one part of the third doping region, and one part of the fourth doping region.

Another exemplary embodiment of an ESD protection device comprises a first SCR and an ESD detection circuit. The first SCR is coupled between a high voltage source and a ground. The ESD detection circuit detects whether an ESD event occurs. When the ESD detection circuit detections that the ESD event occurs, the ESD detection circuit provides a first voltage and a second voltage to the first SCR, so that the first SCR provides a first discharging path.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
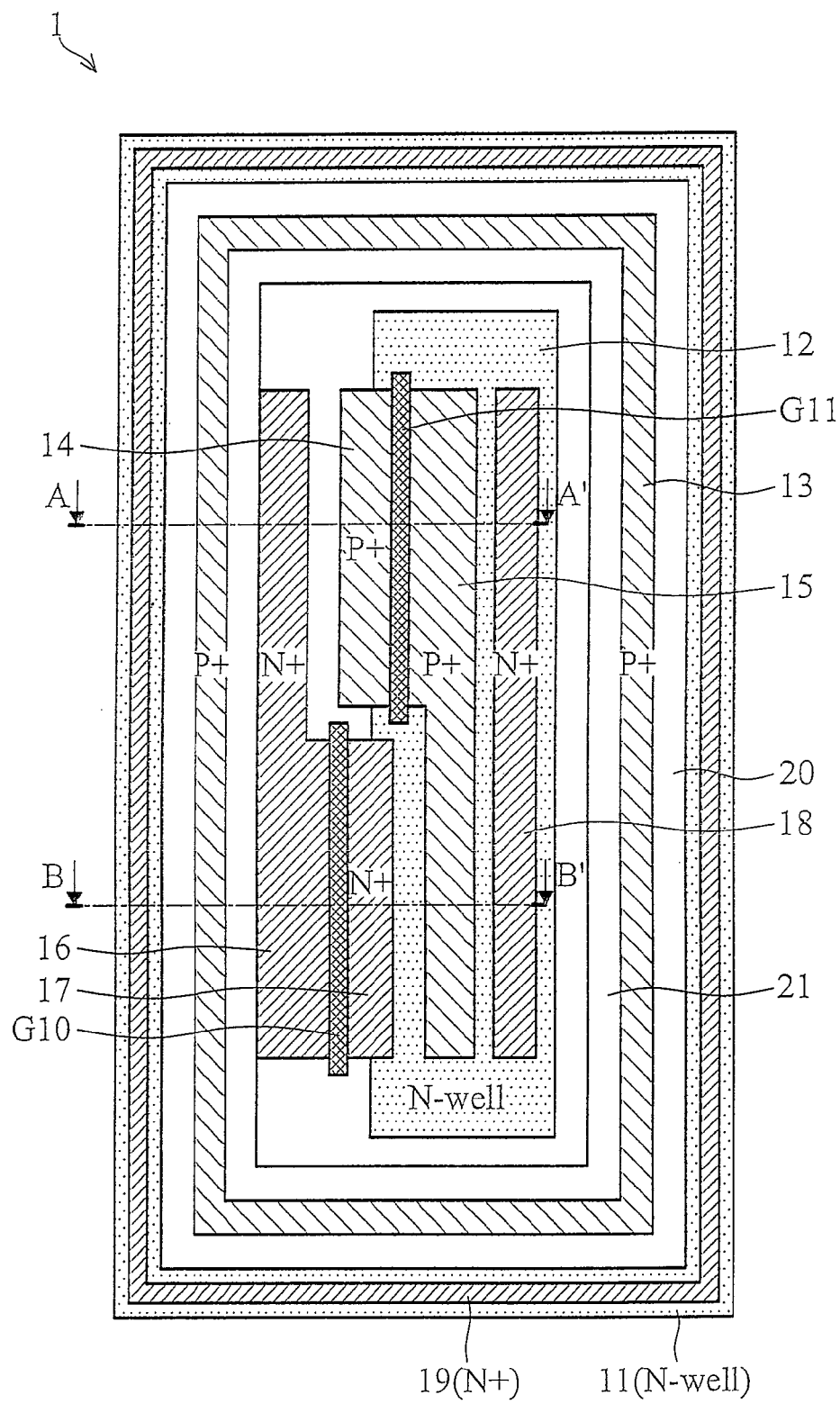
FIG. 1 is a top view of an exemplary embodiment of an SCR semiconductor structure of an ESD protection device.
Figure 2A:
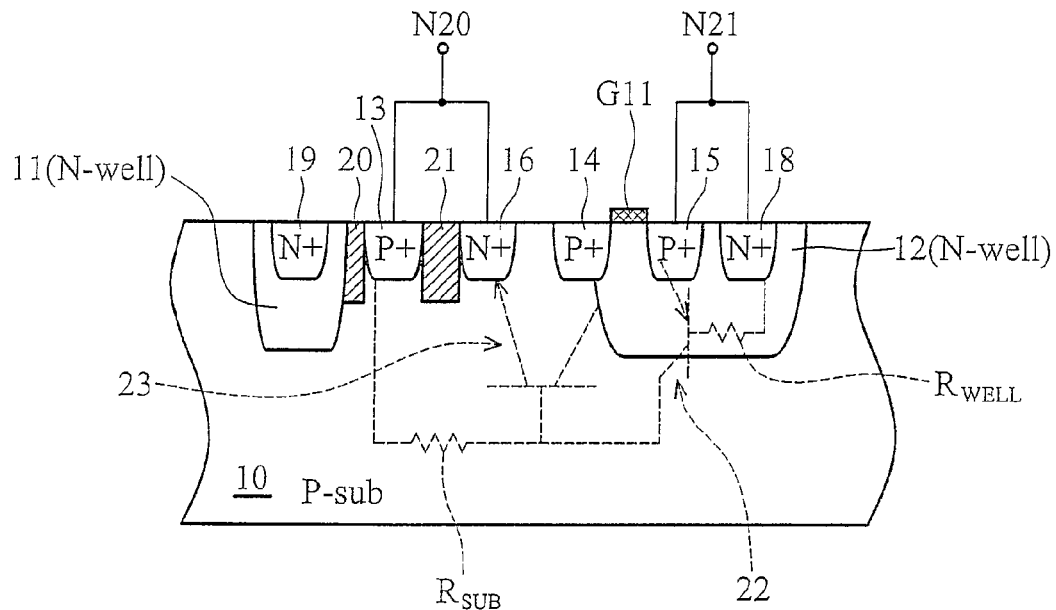
FIGS. 2A-2B are sectional views along lines AA' and BB' in FIG. 1.
Figure 2B:
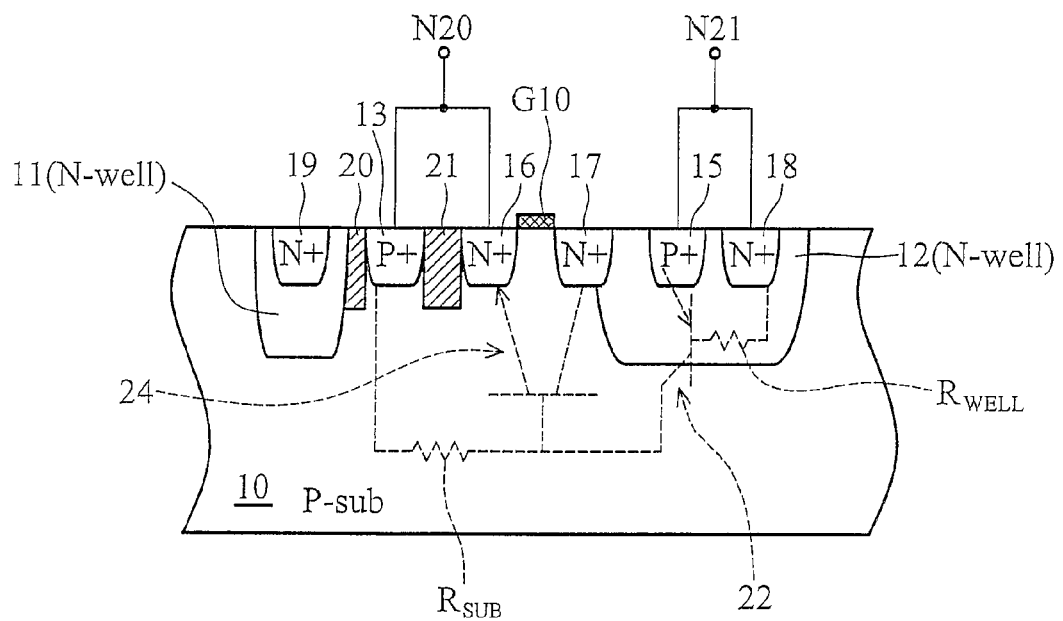

FIG. 1 and FIGS. 2A-2B are top view and sectional views along lines AA' and BB' of an exemplary embodiment of a semiconductor controlled rectifier (SCR) semiconductor structure of an ESD protection device. Referring to FIG. 1 and FIGS. 2A-2B, an SCR 1 of an ESD protection device comprises a P-type substrate (P-sub) 10, N-type well regions (N-well) 11 and 12, P+ doping regions 13-15, N+ doping regions 16-19, isolation structures 20 and 21, and gates G10 and G11. The P+ doping regions 13 is formed in the substrate 10 and encloses an active region. The ESD protection device constitutes at least two MOS transistor structures in the active region. The isolation structure 21 is formed in the substrate and surrounded along the internal of the P+ doping region 13. The N-type well region 11 is formed in the substrate 10 and encloses the P+ doping region 13. The N+ doping region 19 is formed in the N-type well region 11. The isolation structure 20 is formed in the substrate 10 and between the P+ doping region 13 and the N-type well region 11.

In this embodiment, the SCR 1 comprises two MOS transistor structures. One MOS transistor structure comprises the N+ doping regions 16 and 17 and the gate G10, the other comprises the P+ doping regions 14 and 15 and the gate G11. The N+ doping region 16 is formed in the substrate 10 and comprises a first portion and a second portion. The N+ doping region 17 is formed in the substrate and near the second portion potion of the N+ doping region 16. The gate G10 is formed on the substrate 10 and between the second portion of the N+ doping region 16 and the N+ doping region 17. The P+ doping region 14 is formed in the substrate 10 and near the first portion of the N+ doping region 16. The P+ doping region 15 is formed in the substrate 10 and comprises a first portion and a second portion. The second portion of the P+ doping region 15 is near the N+ doping region 17. The gate G11 is formed on the substrate 10 and between the first portion of the P+ doping region 15 and the P+ doping region 14. The well region 12 is formed in the substrate 10 and under one part of the P+ doping region 14, one part of the N+ doping region 17, the P+ doping region 15, and the N+ doping region 18. The N+ doping region 18 is formed in the substrate 10 and on one side of these two MOS transistor structures. Referring to FIGS. 2A-2B, the P+ doping region 13 and the N+ doping region 16 are coupled to a node N20, and the P+ doping region 15 and the N+ doping region 18 are coupled to a node N21.

Figure 3:
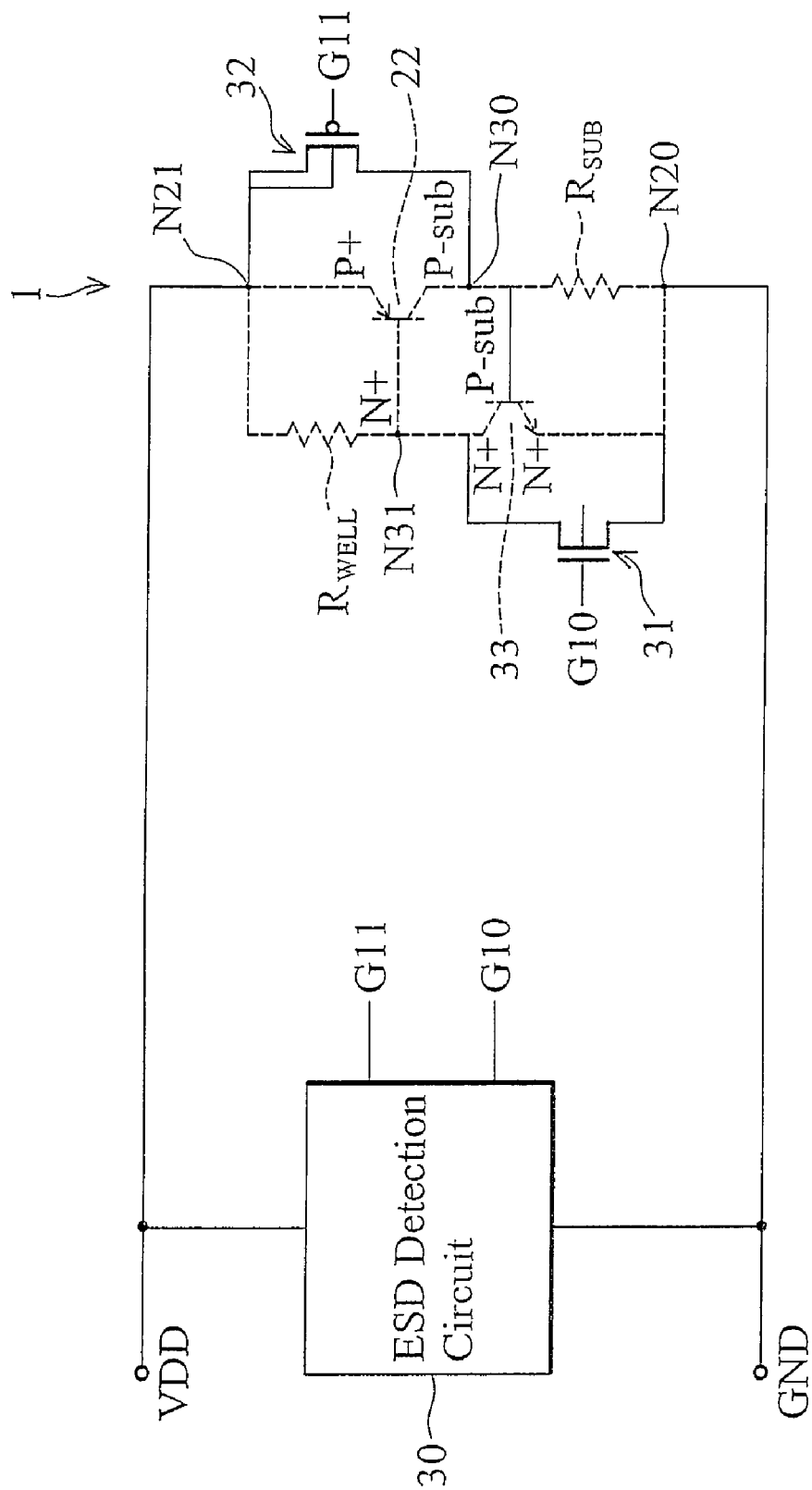
FIG. 3 shows the equivalent circuit of the SCR of the ESD protection device.

FIG. 3 shows the equivalent circuit of the ESD protection device. The ESD protection device comprises the SCR 1 of FIG. 1 and an ESD detection circuit 30. According to above semiconductor structure, the N+ doping regions 16 and 17 and the gate G10 constitutes an NMOS transistor 31, and the N+ doping regions 16 and 17 respectively serve as a source and a drain of the NMOS transistor 31. The P+ doping regions 14 and 15 and the gate G11 constitutes a PMOS transistor 32, and the N+ doping regions 14 and 15 respectively serve as a drain and a source of the PMOS transistor 32.

Referring to FIGS. 2A-2B and FIG. 3, the P+ doping region 15, the N-type well region 12, and the P-type substrate 10 constitute an equivalent P-type BJT transistor 22. The N-type well 12, the P-type substrate 10, and the N+ doping region 16 constitutes an equivalent N-type BJT transistor 23, and the N+ doping region 17, the P-type substrate 10, and the N+ doping region 16 constitutes an equivalent N-type BJT transistor 24. As shown in FIG. 3, the N-type BJT transistors 23 and 24 are represented by an equivalent N-type BJT transistor 33. The equivalent resistance of the N-type well region 12 is represented by $R_{WELL}$, while the equivalent resistance of the P-type substrate 10 is represented by $R_{SUB}$.

Referring to the equivalent circuit in FIG. 3, the source of the PMOS transistor 32 is coupled to the node N21, and a drain thereof is coupled to a node N30. An emitter of the P-type BJT transistor 22 is coupled to the node N21, a collector thereof is coupled to the node N30, and a base thereof coupled to a node N31. The equivalent resistance $R_{WELL}$ is coupled between the nodes N21 and N31. A collector of the N-type BJT transistor 33 is coupled to the node N31, an emitter thereof is coupled to the node N20, and a base thereof is coupled to the N30. The drain of the NMOS transistor 31 is coupled to the node N31, and the source thereof is coupled to the node N20.

Referring to FIG. 3, the ESD detection circuit 30 is coupled between the nodes N20 and N21 and detects whether an ESD event occurs. In this embodiment, the node N20 is coupled to a ground GND, and the node N21 is coupled to a high voltage source VDD. In normal mode, the ESD detection circuit provides a low voltage and a high voltage respectively to the gates G10 and G11 to turn off the MOS transistors 31 and 32. When detecting that the ESD event occurs, the ESD detection circuit 30 provides a high voltage and a low voltage respectively to the gates G10 and G11 to turn on the MOS transistors 31 and 32, so that the SCR 1 provides a discharging path.

Figure 4:
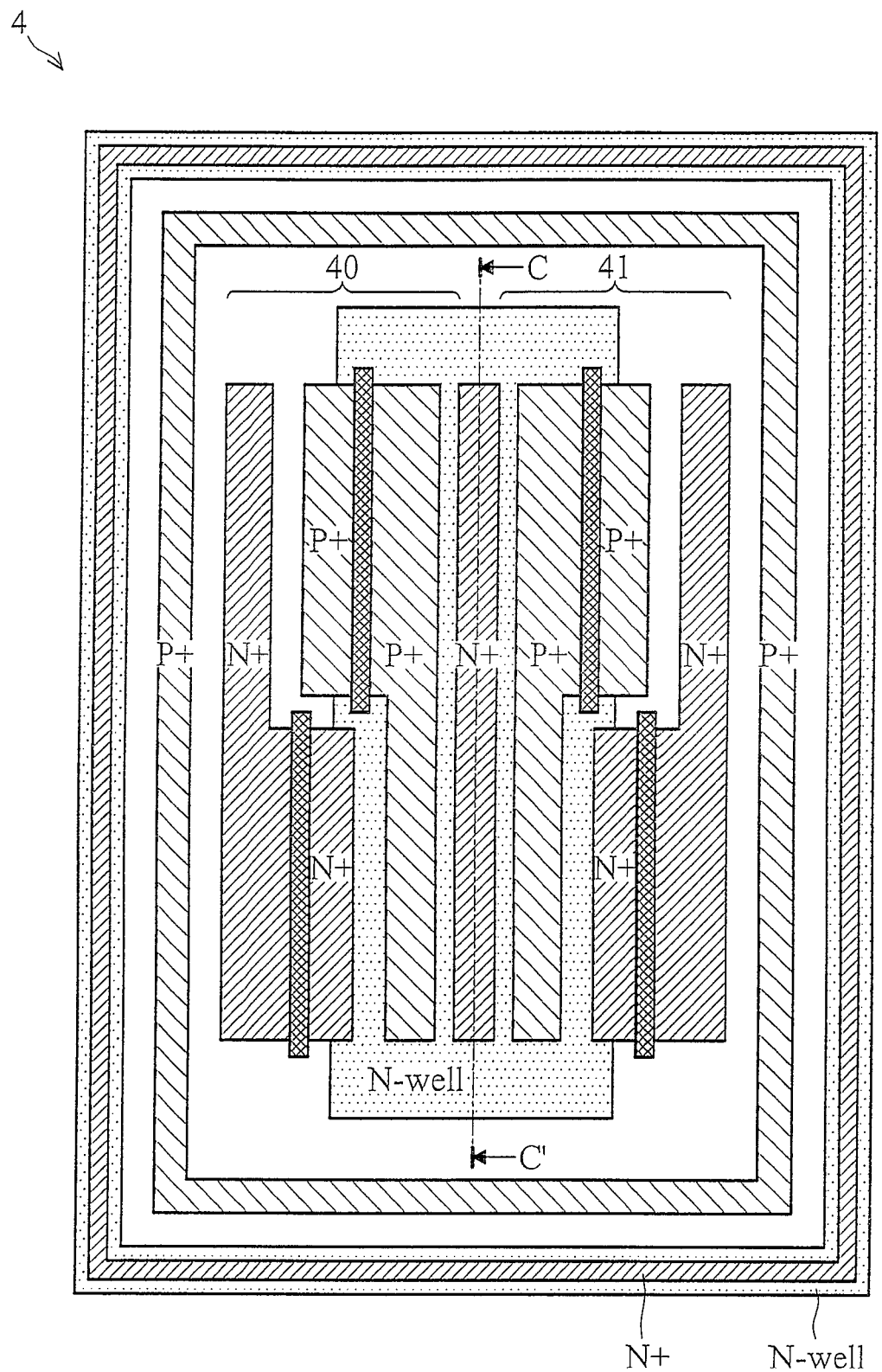
FIG. 4 is a top view of another exemplary embodiment of an SCR semiconductor structure of an ESD protection device.

FIG. 4 is a top view of another exemplary embodiment of an SCR semiconductor structure of an ESD protection device. Referring to FIG. 4, an active region of an SCR 4 comprises two portions 40 and 41 according to a division line CC'. The portion 40 of the SCR 4 has the same semiconductor structure as the active region of the SCR 1. The portion 41 is symmetrical to the portion 40 based on the division line CC'. Thus, the SCR 4 comprises four MOS transistor structures.

Figure 5:
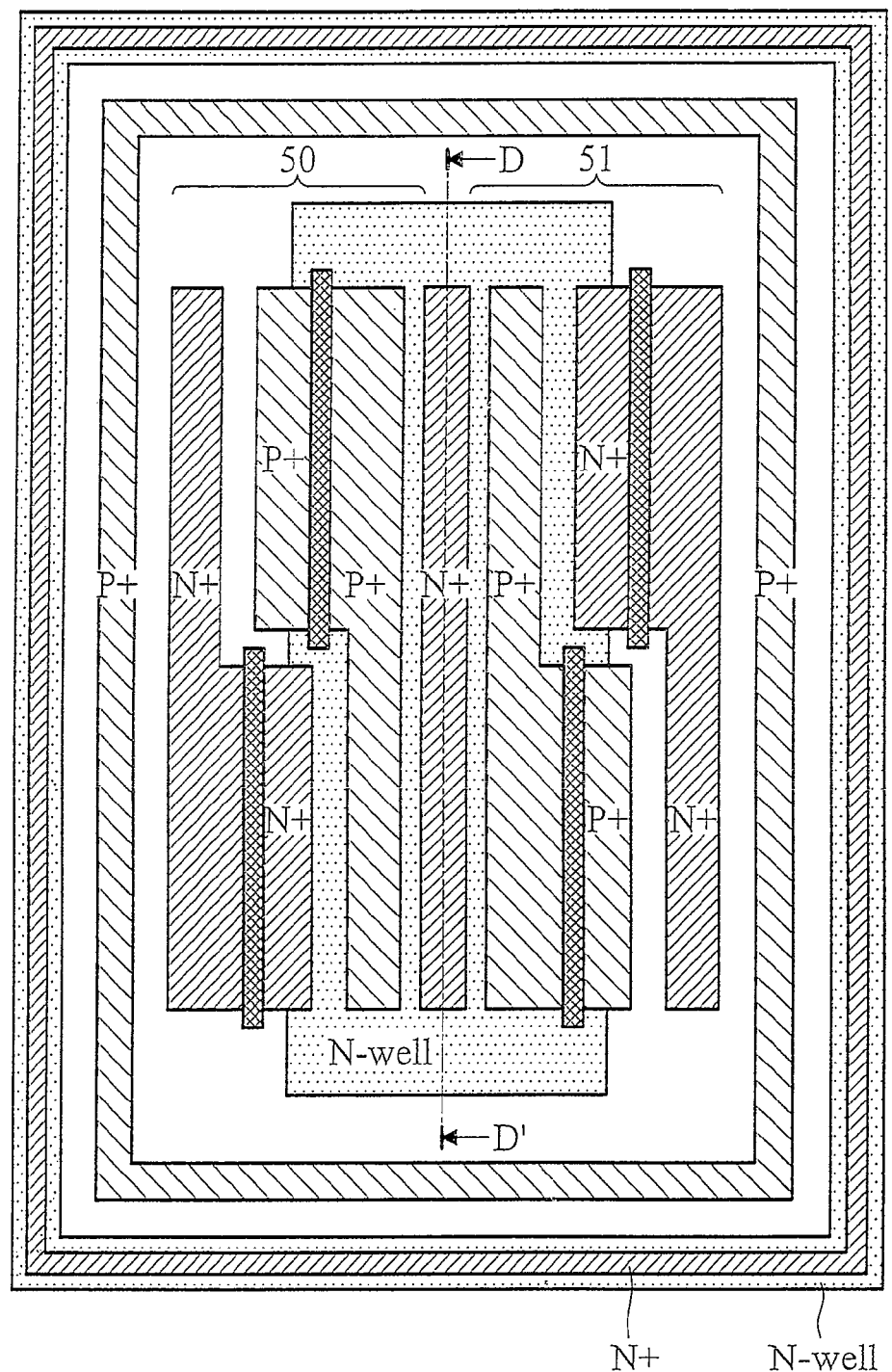
FIG. 5 is a top view of another exemplary embodiment of an SCR semiconductor structure of an ESD protection device.

FIG. 5 is a top view of another exemplary embodiment of an SCR semiconductor structure of an ESD protection device. Referring to FIG. 5, an active region of an SCR 5 comprises two portions 50 and 51 according to a division line DD'. The portion 50 of the SCR 5 has the same semiconductor structure as the active region of the SCR 1. The semiconductor structure of the active region of the SCR 1 is rotated 180 degrees to serve as the portion 51. Thus, the SCR 5 comprises four MOS transistor structures.

Figure 6:
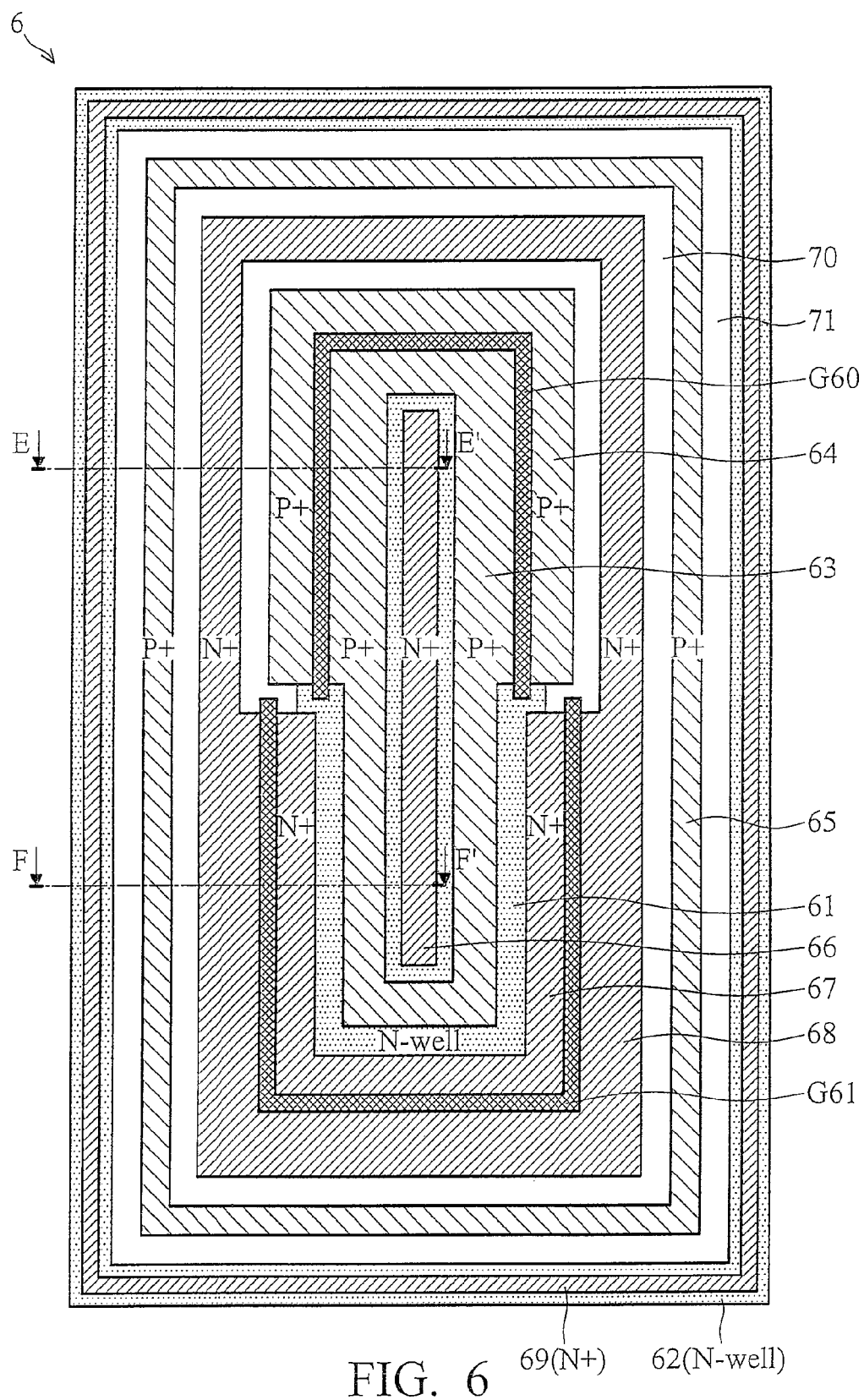
FIG. 6 is a top view of another exemplary embodiment of an SCR semiconductor structure of an ESD protection device.

FIG. 6 is a top view of another exemplary embodiment of an SCR of an ESD protection device. Referring to FIG. 6, an SCR 6 comprises a P-type substrate, N-type well regions 61 and 62, P+ doping regions 63-65, N+ doping regions 66-69, isolation structures 70 and 71, and gates G60 and G61. The N+ doping region 66 is formed in the substrate. The P+ doping region 63 is formed in the substrate and encloses the N+ doping region 66. The P+ doping region 63 comprises a first portion and a second portion. The P+ doping region 64 is formed in the substrate and encloses the first portion of the P+ doping region 63. The gate G60 is formed on the substrate and between the first portion of the P+ doping region 63 and the P+ doping region 64. The N+ doping region 67 is formed in the substrate and encloses the second portion of the P+ doping region 63. Referring to FIG. 6, the P+ doping region 64 has an opening, and the N+ doping region 67 has an opening corresponding to the opening of the P+ doping region 64.

The N+ doping region 68 is formed in the substrate and comprises a first portion and a second portion. The first portion of the N+ doping region 68 encloses the P+ doping region 64, and the second portion thereof encloses the N+ doping region 67. The gate G61 is formed in the substrate and between the second portion of the N+ doping region 68 and the N+ doping region 67. The P+ doping region 65 is formed in the substrate and encloses the N+ doping region 68. The isolation structure 70 is formed in the substrate and between the N+ doping region 68 and the P+ doping region 65. The N-type well region 62 is formed in the substrate and encloses the P+ doping region 65. The isolation structure 71 is formed in the substrate and between the N-type well region 62 and the P+ doping region 65. The N+ doping region 69 is formed in the N-type well region 62. The N-type well region 61 is formed in the substrate and under the N+ doping region 66, the P+ doping region 63, one part of the P+ doping region 64, and one part of the N+ doping region 67. Moreover, the P+ doping region 63 and the N+ doping region 66 are coupled to one node, and the P+ doping region 65 and the N+ doping region 68 are coupled to the other node.

According to the structure of the SCR 6, there are four MOS transistor structures to form four MOS transistors. The P+ doping regions 63 and 64 and the gate G60 constitute two MOS transistors, and the N+ doping regions 67 and 68 and the gate G61 constitute the other two MOS transistors. When the SCR 6 is applied with an ESD detection circuit, such as the ESD detection circuit 30 of FIG. 3, the node coupled to the P+ doping region 63 and the N+ doping region 66 is coupled to a high voltage source, and the node coupled to the P+ doping region 65 and the N+ doping region 68 is coupled to a ground. The sectional views along lines EE' and FF' in FIG. 6 are the same as the sectional views of FIGS. 2A and 2B, respectively.

Figure 7:
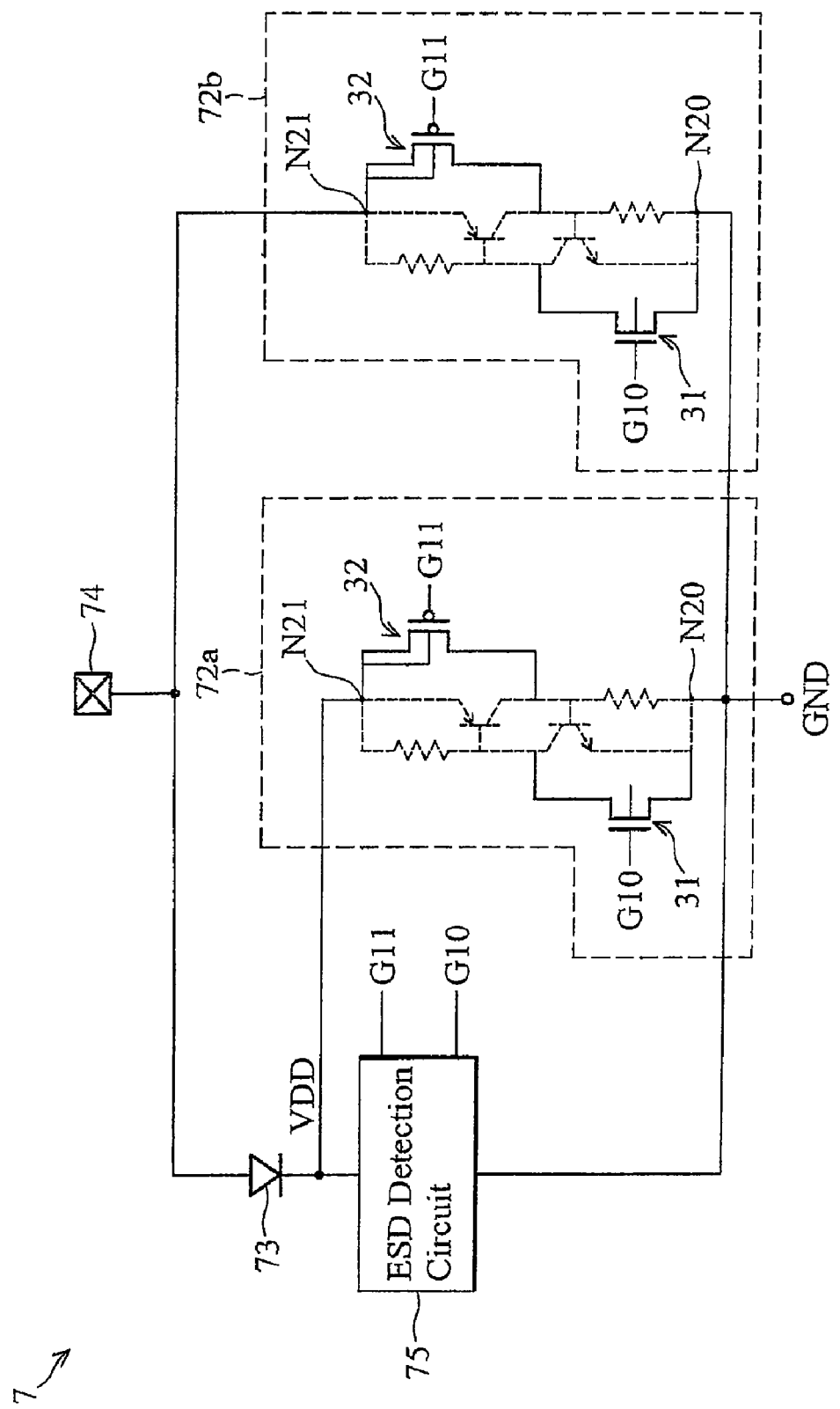
FIG. 7 shows an exemplary embodiment of an ESD protection device.

Each of the above SCRs 1, 4, 5 and 6 can be coupled between an I/O pad and a ground GND. Referring to FIG. 7, an ESD protection device 7 comprises an ESD detection circuit 75, SCRs 72a-72b, and a diode 73. The SCR 72a is coupled between a high voltage source VDD and a ground GND, and the SCR 72b is coupled between an I/O pad 74 and the ground GND. The SCRss 72a-72b, have the same equivalent circuit, and each of the SCRs 72a-72b has the same semiconductor structure as the SCR 1, 4, 5, or 6. For example, each of the SCRs 72a-72b has the same structure as the SCR 1. The diode 73 is coupled between the I/O pad 74 and the ESD detection circuit 75.

The ESD detection circuit 75 is coupled between the high voltage source VDD and the ground GND and detects whether an ESD event occurs. In normal mode, the ESD detection circuit 75 provides a low voltage and a high voltage respectively to the gates G10 and G11 of the SCRs 72a-72b to turn off the MOS transistors 31 and 32 thereof. When detecting that the ESD event occurs, the ESD detection circuit 75 provides a high voltage and a low voltage respectively to the gates G10 and G11 of the SCRs 72a-72b to turn on the MOS transistors 31 and 32 thereof, so that each of the SCRs 72a-72b provides a discharging path.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An ESD protection device comprising:
    a substrate;
    a first doping region formed in the substrate and enclosing an active region, wherein the first doping region is coupled to a first node;
    a first MOS transistor structure on the internal of the active region, comprising:
        a second doping region formed in the substrate and comprising a first portion and a second portion, wherein the second doping region is coupled to the first node;
        a third doping region formed in the substrate; and
        a first gate formed on the substrate and between the second portion of the second doping region and the third doping region;
    a second MOS transistor structure on the internal of the active region, comprising:
        a fourth doping region formed in the substrate and comprising a first portion and a second portion, wherein the fourth doping region is coupled to a second node;
        a fifth doping region formed in the substrate; and
        a second gate formed on the substrate and between the first portion of the fourth doping region and the fifth doping region;
    wherein the third doping region is near the second portion of the fourth doping region, and the fifth doping region is near the first portion of the second doping region;
    a sixth doping region formed in the substrate and on one side of the first and second MOS transistor structures, wherein the sixth doping region is coupled to the second node; and
    a first well region on the internal of the active region, formed in the substrate and under one part of the third doping region, one part of the fifth doping region, the fourth doping region, and the sixth doping region.

2. The ESD protection device as claimed in claim 1 further comprising:
    a second well region formed in the substrate and enclosing the first doping region;
    a first isolation structure formed in the substrate and between the first doping region and the second well region; and
    a second isolation structure formed in the substrate, wherein the second isolation structure is surrounded along the internal of the first doping region and between the first doping region and the second doping region.

3. The ESD protection device as claimed in claim 1, wherein the second doping region, the third doping region, and the first gate constitute a first MOS transistor, and the fourth doping region, the fifth doping region, and the second gate constitute a second MOS transistor.

4. The ESD protection device as claimed in claim 3 further comprising an ESD detection circuit coupled between the first and second nodes and detecting whether an ESD event occurs, wherein when the ESD event occurs, the ESD detection circuit provides a first voltage and a second voltage respectively to the first gate and the second gate to turn on the first MOS transistor and the second MOS transistor.

5. The ESD protection device as claimed in claim 3, wherein the first MOS transistor is N-type, and the second MOS transistor is P-type.

6. The ESD protection device as claimed in claim 1, wherein the first node is coupled to a ground, and the second node is coupled to a high voltage source.

7. The ESD protection device as claimed in claim 1, wherein the first node is coupled to a ground, and the second node is coupled to an I/O pad.

8. An ESD protection device comprising:
    a substrate;

a first doping region formed in the substrate and coupled to a first node;

a second doping region formed in the substrate and enclosing the first doping region, wherein the second doping region comprises a first portion and a second portion and is coupled to the first node;

a third doping region formed in the substrate and enclosing the first portion of the second doping region, wherein the third doping region has a first opening;

a first gate formed on the substrate and between the first portion of the second doping region and the third doping region;

a fourth doping region formed in the substrate and enclosing the second portion of the second doping region, wherein the fourth doping region has an a second opening corresponding to the first opening;

a fifth doping region formed in the substrate and comprising a first portion and a second portion, wherein the first portion of the fifth doping region encloses the third doping region, and the second portion thereof encloses the fourth doping region;

a second gate formed in the substrate and between the second portion of the fifth doping region and the fourth doping region;

a sixth doping region formed in the substrate and enclosing the fifth doping region, wherein the fifth and sixth doping regions are coupled to a second node; and a first well region formed in the substrate and under the first doping region, the second doping region, one part of the third doping region, and one part of the fourth doping region.

9. The ESD protection device as claimed in claim 8 further comprising:

a second well region formed in the substrate and enclosing the sixth doping region;

a first isolation structure formed in the substrate and between the second well region and the sixth doping region; and a second isolation structure formed in the substrate and between the fifth and sixth doping regions.

10. The ESD protection device as claimed in claim 8, wherein the second doping region, the third doping region, and the first gate constitute a first MOS transistor, and the fourth doping region, the fifth doping region, and the second gate constitute a second MOS transistor.

11. The ESD protection device as claimed in claim 10 further comprising an ESD detection circuit coupled between the first and second nodes and detecting whether an ESD event occurs, wherein when the ESD event occurs, the ESD detection circuit provides a first voltage and a second voltage respectively to the first gate and the second gate to turn on the first MOS transistor and the second MOS transistor.

12. The ESD protection device as claimed in claim 10, wherein the first MOS transistor is P-type, and the second MOS transistor is N-type.

13. The ESD protection device as claimed in claim 8, wherein the first node is coupled to high voltage source, and the second node is coupled to a ground.

14. The ESD protection device as claimed in claim 8, wherein the first node is coupled to an I/O pad, and the second node is coupled to a ground.

* * * * *